US012763746B2

(12) United States Patent
Darvishi et al.

(10) Patent No.: US 12,763,746 B2
(45) Date of Patent: Oct. 13, 2026

(54) NOTCH FILTER FOR WIRELESS CIRCUITRY

(71) Applicant: Apple Inc., Cupertino, CA (US)

(72) Inventors: Milad Darvishi, San Diego, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 18/890,576

(22) Filed: Sep. 19, 2024

(65) Prior Publication Data

US 2026/0081575 A1 Mar. 19, 2026

(51) Int. Cl.
*H03H 7/06* (2006.01)
*H03H 7/01* (2006.01)

(52) U.S. Cl.
CPC ......... *H03H 7/06* (2013.01); *H03H 2007/013* (2013.01)

(58) Field of Classification Search
CPC ........................... H03H 7/06; H03H 2007/013
USPC ................................. 333/175, 176, 204, 205
See application file for complete search history.

(56) References Cited

U.S. PATENT DOCUMENTS 3,411,098 A * 11/1968 Perra .................. H03H 11/1295 331/142
7,031,689 B2 4/2006 Frank
7,415,286 B2 8/2008 Behzad
7,697,915 B2 4/2010 Behzad et al.
8,050,318 B2 11/2011 Phanse et al.
8,536,939 B2 9/2013 Shibata et al.
8,604,879 B2 12/2013 Mourant et al.
10,128,819 B2 11/2018 Hedayati et al.
10,211,865 B1 2/2019 Miller et al.
11,206,006 B2 12/2021 Bagga
2002/0047757 A1* 4/2002 Manku ..................... H03H 7/07 333/170
2008/0094153 A1 4/2008 Wang et al.
2008/0195180 A1 8/2008 Stevenson et al.
2022/0393574 A1 12/2022 Pervaiz et al.

* cited by examiner

*Primary Examiner* — Jorge L Salazar, Jr.

(74) *Attorney, Agent, or Firm* — Treyz Law Group; Jason Tsai

(57) ABSTRACT

Wireless circuitry can include one or more notch filters. A notch filter can include a series inductor having a first terminal coupled to an input and having a second terminal coupled to an output, a first series capacitor having a first terminal coupled to the input and having a second terminal coupled to a node, a second series capacitor having a first terminal coupled to the output and having a second terminal coupled to the node, and a shunt resistor having a first terminal coupled to the node and having a second terminal coupled to a ground line. The notch filter can further include a shunt capacitor coupled in series with the shunt resistor between the node and the ground line. The shunt resistor can be a tunable resistor.

17 Claims, 7 Drawing Sheets

NOTCH FILTER FOR WIRELESS CIRCUITRY

FIELD

This disclosure relates generally to electronic devices, including electronic devices with wireless circuitry.

BACKGROUND

Electronic devices can be provided with wireless capabilities. An electronic device with wireless capabilities has wireless circuitry that includes one or more antennas. A transmitter in the wireless circuitry uses the antennas to transmit wireless signals. A receiver in the wireless circuitry receives wireless signals from the antennas.

The wireless circuitry can include one or more notch filters. A conventional notch filter includes an inductor coupled in parallel with a capacitor. The inductor can, however, exhibit parasitic ohmic resistance. Such parasitic ohmic resistance associated with the inductor can limit the filtering or signal rejection capabilities of the notch filter.

SUMMARY

An aspect of the disclosure provides a filter circuit that includes a first component of a first type coupled between a filter input port and a filter output port, a second component of a second type, different than the first type, having a first terminal coupled to the filter input port and having a second terminal coupled to a node, and a third component of a third type, different than the first and second types, having a first terminal coupled to the node and having a second terminal coupled to a power supply line. The first component of the first type can be an inductor having a first terminal coupled to the filter input port and a second terminal coupled to the filter output port. The second component of the second type can be a first capacitor. The third component of the third type can be a shunt resistor. The filter circuit can further include a fourth component of the second type having a first terminal coupled to the filter output port and having a second terminal coupled to the node. The fourth component of the second type can be a second capacitor.

An aspect of the disclosure provides a notch filter that includes a series inductor having a first terminal coupled to an input and having a second terminal coupled to an output, a first series capacitor having a first terminal coupled to the input and having a second terminal coupled to a node, a second series capacitor having a first terminal coupled to the output and having a second terminal coupled to the node, a shunt resistor having a first terminal coupled to the node and having a second terminal coupled to a ground line, and a shunt capacitor coupled in series with the shunt resistor between the node and the ground line.

An aspect of the disclosure provides a notch filter that includes a series inductor having a first terminal coupled to an input and having a second terminal coupled to an output, a first series capacitor having a first terminal coupled to the input and having a second terminal coupled to a node, a second series capacitor having a first terminal coupled to the output and having a second terminal coupled to the node, and a shunt resistor having a first terminal directly coupled to the node and having a second terminal coupled to ground.

DETAILED DESCRIPTION

Figure 1:
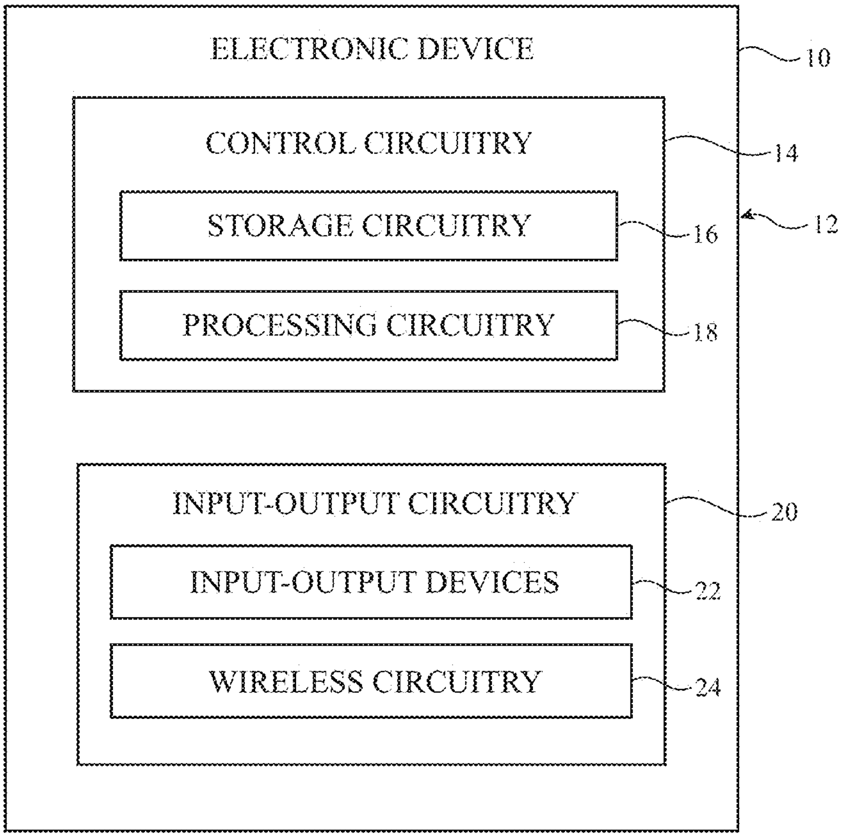
FIG. 1 is a diagram of an illustrative electronic device having wireless circuitry in accordance with some embodiments.

An electronic device such as an electronic device 10 of FIG. 1 may include one or more notch filter circuits. A notch filter circuit can include a inductor, first and second capacitors coupled in series with one another and coupled in parallel with the inductor, and a shunt resistor coupled to a node disposed between the first and second capacitors. The use of the shunt resistor can help improve the signal rejection at a notch (resonant) frequency of the notch filter. If desired, an additional shunt capacitor can be coupled in series with the shunt resistor at the node to further reduce the in-band signal loss while providing further improved signal rejection at the notch frequency.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), Sixth Generation (6G) protocols, sub-THz protocols. THz protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output (I/O) circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), cellular sidebands, 6G bands between 100-1000 GHz (e.g., sub-THz, THz, or THF bands), etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
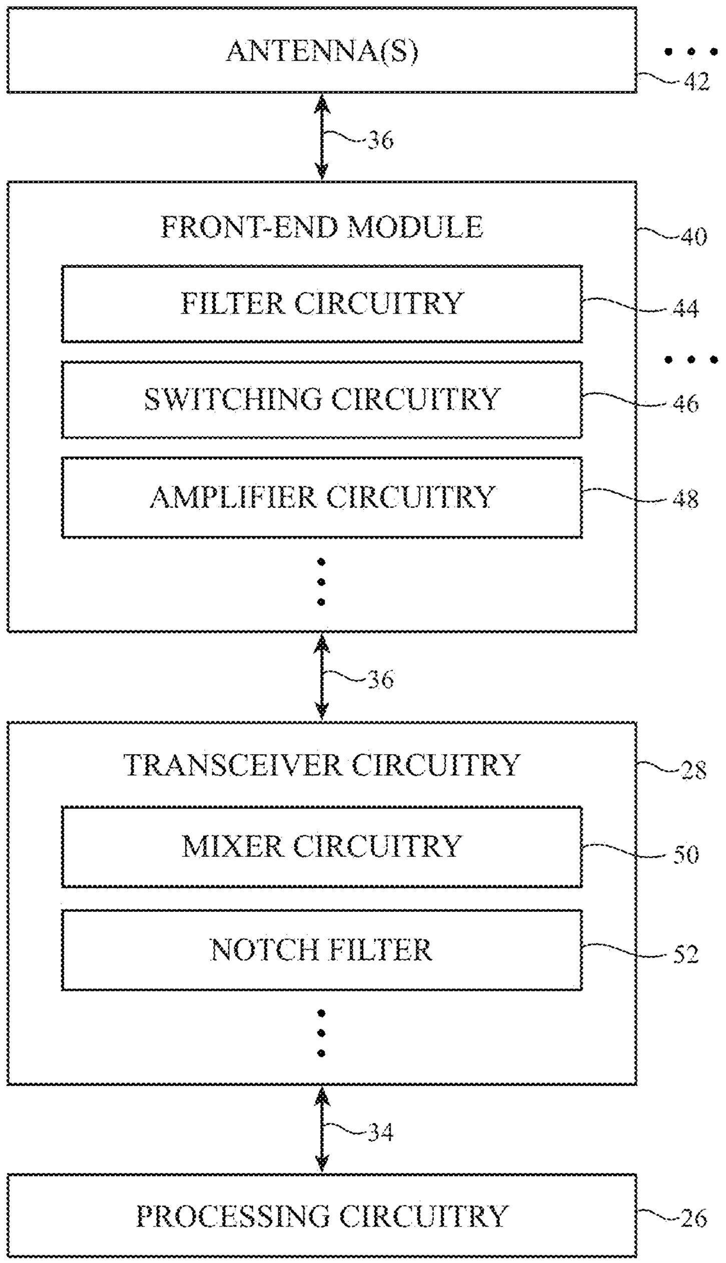
FIG. 2 is a diagram of illustrative wireless circuitry having one or more notch filters in accordance with some embodiments.

FIG. 2 is a diagram showing illustrative components within wireless circuitry 24. As shown in FIG. 2, wireless circuitry 24 may include processing circuitry such as processing circuitry 26, radio-frequency (RF) transceiver circuitry such as radio-frequency transceiver 28, radio-frequency front-end circuitry such as radio-frequency front-end module (FEM) 40, and antenna(s) 42. Processing circuitry 26 may be a baseband processor, an application processor, a digital signal processor, a microcontroller, a microprocessor, a central processing unit (CPU), a programmable device, a combination of these circuits, and/or one or more processors within circuitry 18. Processing circuitry 26 may be configured to generated digital (baseband) signals.

In the example of FIG. 2, wireless circuitry 24 is illustrated as including only a single processing unit 26, a single transceiver 28, a single front-end module 40, and a single antenna 42 for the sake of clarity. In general, wireless circuitry 24 may include any desired number of processing units 26, any desired number of transceivers 28, any desired number of front-end modules 40, and any desired number of antennas 42. Each processing unit 26 may be coupled to one or more transceivers 28 over respective baseband paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front-end module 40 disposed thereon. If desired, two or more front-end modules 40 may be disposed on the same radio-frequency transmission line path 36. If desired, one or more of the radio-frequency transmission line paths 36 in wireless circuitry 24 may be implemented without any front-end module.

Processing circuitry 26 may be coupled to transceiver 28 over baseband path 34. Transceiver 28 may be coupled to antenna 42 via radio-frequency transmission line path 36. Radio-frequency front-end module 40 may be disposed on radio-frequency transmission line path 36 between transceiver 28 and antenna 42. Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is merely illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards.

Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Front-end module (FEM) 40 may include radio-frequency front-end circuitry that operates on the radio-frequency signals conveyed (transmitted and/or received) over radio-frequency transmission line path 36. Front-end module 40 may, for example, include front-end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front-end module components may be mounted to a common (shared) substrate such as a rigid printed circuit board substrate or flexible printed circuit substrate. If desired, the various front-end module components may also be integrated into a single integrated circuit chip or on separate integrated circuit chips.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Transceiver 28 may be separate from front-end module 40. For example, transceiver 28 may be formed on another substrate such as the main logic board of device 10, a rigid printed circuit board, or flexible printed circuit that is not a part of front-end module 40. While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processing circuitry 26 and/or portions of transceiver 28 (e.g., a host processor on transceiver 28) may form a part of control circuitry 14. Control circuitry 14 (e.g., portions of control circuitry 14 formed on processing circuitry 26, portions of control circuitry 14 formed on transceiver 28, and/or portions of control circuitry 14 that are separate from wireless circuitry 24) may provide control signals (e.g., over one or more control paths in device 10) that control the operation of front-end module 40.

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHZ WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio (NR) Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processing circuitry 26 may provide baseband signals to transceiver 28 over baseband path 34. Transceiver 28 may further include circuitry for converting the baseband signals received from processing circuitry 26 into corresponding radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front-end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front-end module 40. Transceiver 28 may include circuitry for converting the received radio-frequency signals into corresponding baseband signals. For example, transceiver 28 may use mixer circuitry 50 for down-converting (or demodulating) the received radio-frequency signals to intermediate frequencies or baseband frequencies prior to conveying the received signals to processing circuitry 26 over baseband path 34.

Transceiver 28 may further include a filter circuit such as a notch filter 52. A notch filter may refer to and be defined herein as a filter configured to attenuate signals in a specific band of frequencies while allowing signals at frequencies outside that band to pass through relatively unaffected. The specific frequency at which notch filter 52 is configured to reject or attenuate signals is sometimes referred to as a notch frequency, a rejection frequency, or a null frequency. The notch frequency is also the frequency at which the component within filter 52 is configured to resonate, so the notch frequency is also sometimes referred to as a "resonant" frequency. Notch filter 52 is often used to reject signals at unwanted frequencies, such as to reject undesired harmonic signals, undesired intermodulation signals, or other spurious emissions. Notch filter 52 is also sometimes referred to as a "band-stop" filter, a "band-reject" filter, or a "frequency-rejection" filter. Although notch filter 52 is shown as being part of transceiver 28, filter 52 can be formed separate from transceiver 28 as part of front-end module 40, as a separate component on baseband path 34, as a separate component on radio-frequency transmission line path 36, as part of processing circuitry 26, as part of antenna 42, or as part of another portion of wireless circuitry 24.

Figure 3:
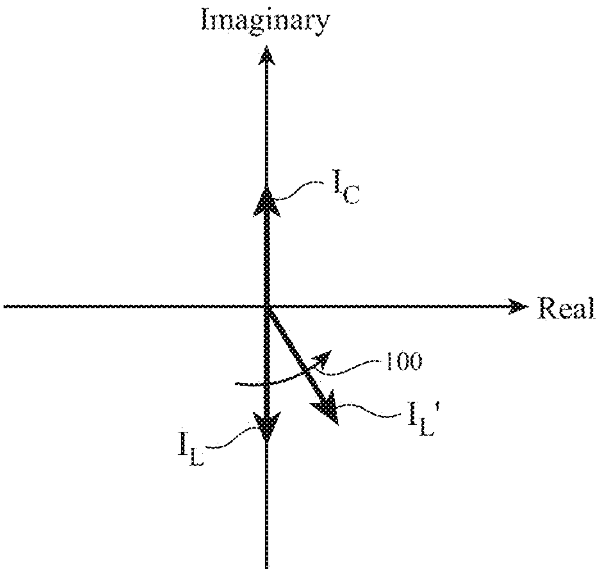
FIG. 3 is a diagram of a complex plane illustrating current flow associated with a notch filter.

A conventional notch filter includes an inductor coupled in parallel with a capacitor. In practice, the inductor can exhibit parasitic ohmic resistance that limits the quality (Q) factor of the inductor. FIG. 3 is a diagram of a complex plane illustrating current flow associated with a notch filter. The X-axis is the real axis, whereas the Y-axis is the imaginary axis. As shown in FIG. 3, current $I_C$ represents the current flowing through the capacitor, whereas current $I_L$ represents the current flowing through the inductor. Ideally, if the inductor did not exhibit any parasitic ohmic resistance, the inductor current $I_L$ is equal and opposite to the capacitor current $I_C$ and the two components can fully cancel out with each other at the resonant (notch) frequency. In practice, however, the inductor current can exhibit some non-zero real component due to the associated parasitic ohmic resistance, which can result in an inductor current $I_L'$, as shown by arrow 100. As shown in FIG. 3, the rotated inductor current $I_L'$ is not exactly out-of-phase with the capacitor current $I_C$ and the two components will thus not cancel out with one another.

Figure 4:
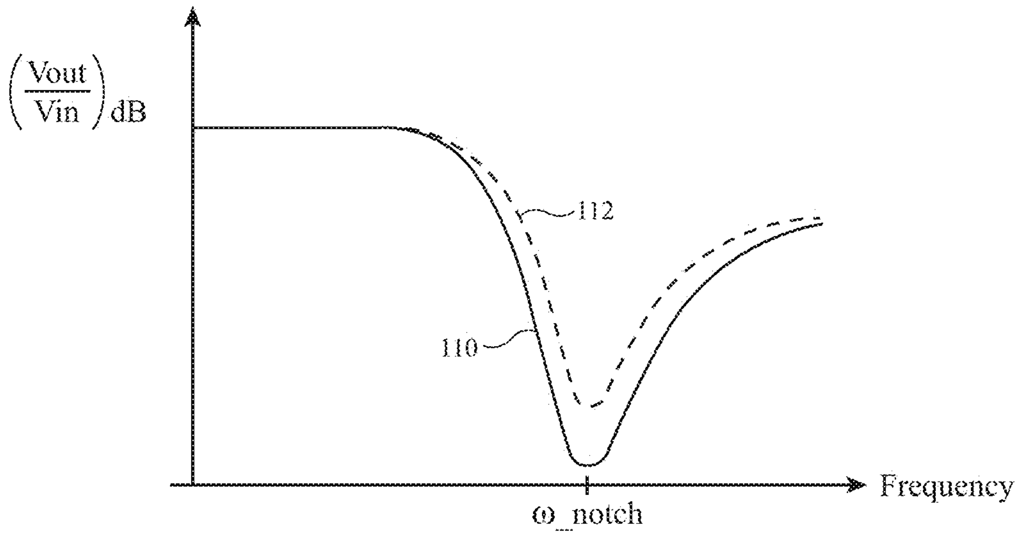
FIG. 4 is a diagram illustrating notch filter transfer functions.

FIG. 4 is a diagram illustrating notch filter transfer functions associated with the scenarios described in connection with FIG. 3. In particular, FIG. 4 plots the magnitude of Vout divided by Vin (in decibel scale) as a function of angular frequency, where Vin represents a voltage level at an input of a notch filter and where Vout represents a voltage level at an output of the notch filter. Curve 110 represents a first filter response corresponding to the first scenario described above in connection with FIG. 3 where currents $I_C$ and $I_L$ are ideally out-of-phase with one another, whereas curve 112 represents a second filter response corresponding to the second scenario described above in connection with FIG. 3 where currents $I_C$ and $I_L'$ are not exactly out-of-phase with one another due to the parasitic ohmic resistance associated with the inductor. As shown in FIG. 4, curve 112 exhibits a reduced amount of rejection (attenuation) at the notch frequency ω_notch compared to the ideal filter curve 110. In other words, the presence of the parasitic ohmic resistance of the inductor degrades the notch filter's ability to reject signals at the resonant frequency.

Figure 5:
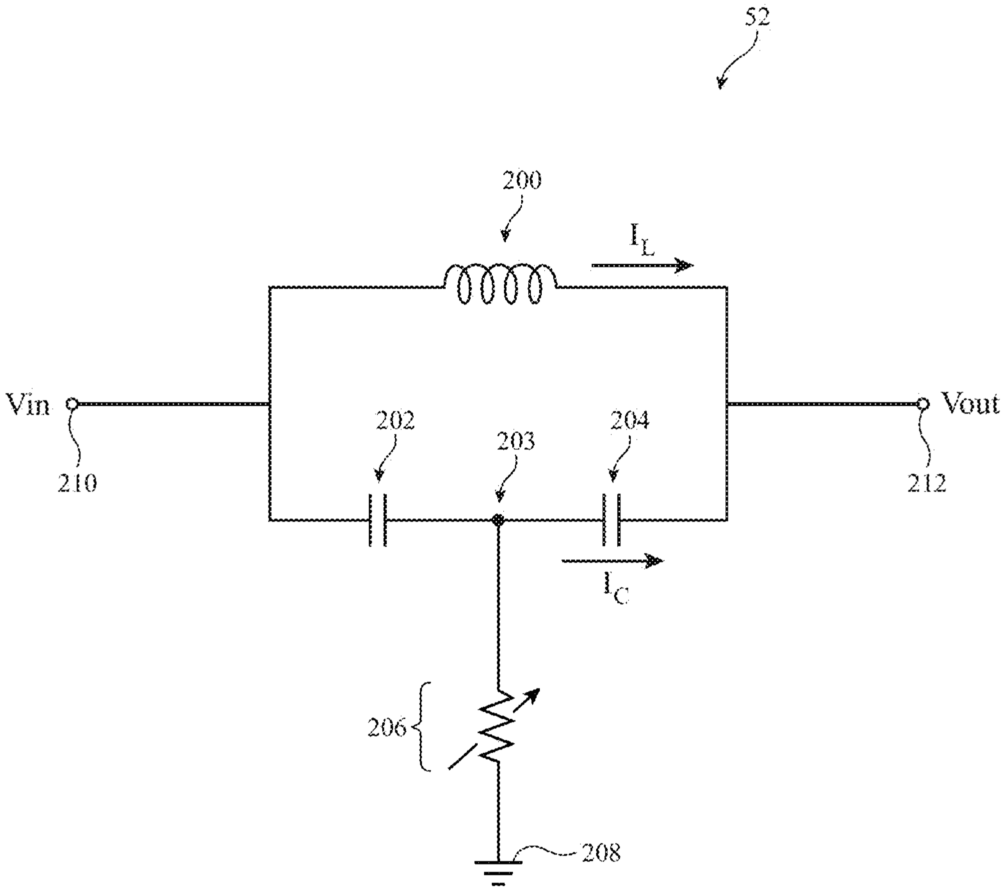
FIG. 5 is a circuit diagram of an illustrative notch filter circuit in accordance with some embodiments.

In accordance with an embodiment, notch filter 52 is provided that help alleviate or mitigate such degradation of the filter response. FIG. 5 is a circuit diagram of an improved notch filter circuit 52. As shown in FIG. 5, notch filter 52 may include an inductive component such as inductor 200, capacitive components such as a first capacitor 202 and a second capacitor 204, and a resistive component such as resistor 206. Inductor 200 may have a first terminal coupled to a filter input terminal 210 (e.g., an input port at which input voltage Vin is received) and a second terminal coupled to a filter output terminal 212 (e.g., an output port at which output voltage Vout is produced). A current $I_L$, can flow through inductor 200. Inductor 200 coupled between the input and output terminals 210 and 212 in this way can be referred to as a "series" inductor.

First capacitor 202 may have a first terminal coupled to filter input 210 and a second terminal coupled to a node 203. Second capacitor 204 may have a first terminal coupled to filter output 212 and a second terminal coupled to node 203. A current $I_C$ can flow through at least capacitor 204. Capacitors 202 and 204 coupled between the input and output terminals 210 and 212 in this way can be referred to as first and second "series" capacitors, respectively.

Resistor 206 can have a first terminal coupled to node 203 disposed between capacitors 202 and 204 and a second terminal coupled to a ground power supply line 208 (e.g., a ground power supply terminal on which a ground voltage is provided). Resistor 206 coupled to ground line 208 in this way is sometimes referred to as a "shunt" resistor. Resistor 206 can be an adjustable resistor implemented as a bank of switchable resistors (e.g., an array of resistors each of which is selectively activated by a respective switch), one or more transistors having gate terminals configured to receive an analog control voltage, a resistive ladder, a variable resistor (e.g., a digitally controlled resistor), one or more transistors coupled together in parallel and/or in series, and/or other components configured to provide a variable resistance. The resistance of resistor 206 can be adjusted or trimmed to optimize the amount of signal rejection/attenuation provided by notch filter 52. In general, inductors, capacitors, and resistors can be considered different types of electrical components.

Notch filter 52 of FIG. 5 can exhibit a notch (resonant) frequency computed as follows:

$$\omega\_\text{notch} = \sqrt{\frac{2}{LC}} \tag{1}$$

where L represents the inductance of inductor 200 and where C represents the capacitance of each of capacitors 202 and 204. In other words, the capacitance value of capacitor 202 should be equal to the capacitance value of capacitor 204. Moreover, the resistance Rsh of the shunt resistor 206 should be computed as follows:

$$Rsh = \frac{L}{2R_L C} \tag{2}$$

where $R_L$ represents the parasitic ohmic resistance of inductor 200. As shown in equation (2), a higher parasitic ohmic resistance can result in a lower shunt resistance of resistor 206, and vice versa. In other words, the resistance of shunt resistor 206 may be a function of L, C, and $R_L$. The use of shunt resistor 206 can help ensure that inductor current $I_L$ fully cancels out with capacitor current $I_C$ at the resonant frequency. Regardless, the notch frequency as computed in accordance with equation (1) above is not a function of the shunt resistance Rsh. In other words, the notch (resonant) frequency of notch filter 52 will not shift even if the resistance of shunt resistor 206 fluctuates due to process variations. Notch filter 52 configured in this way is thus technically advantageous and beneficial to provide improved signal attenuation at the notch frequency with reduced sensitivity to process variations.

Figure 6:
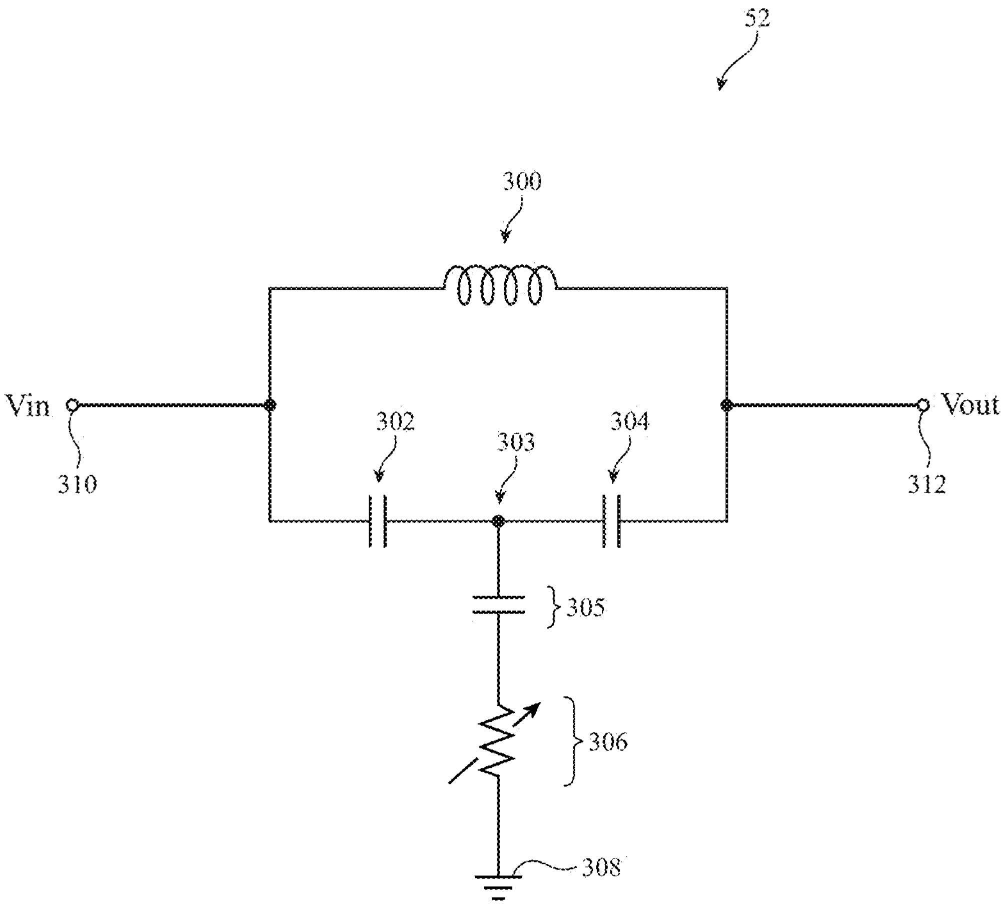
FIG. 6 is a circuit diagram showing another implementation of a notch filter circuit in accordance with some embodiments.

The embodiment of FIG. 5 in which notch filter 52 includes a single shunt component (e.g., shunt resistor 206) is exemplary. FIG. 6 shows another embodiment of notch filter 52. As shown in FIG. 6, notch filter 52 may include an inductive component such as inductor 300, capacitive components such as a first capacitor 302, a second capacitor 304, and a third capacitor 305, and a resistive component such as resistor 306. Inductor 300 may have a first terminal coupled to a filter input terminal 310 (e.g., an input port at which input voltage Vin is received) and a second terminal coupled to a filter output terminal 312 (e.g., an output port at which output voltage Vout is produced). Inductor 300 coupled between the input and output terminals 310 and 312 in this way can be referred to as a "series" inductor.

First capacitor 302 may have a first terminal coupled to filter input 310 and a second terminal coupled to a node 303. Second capacitor 304 may have a first terminal coupled to filter output 312 and a second terminal coupled to node 303. Capacitors 302 and 304 coupled between the input and output terminals 310 and 312 in this way can be referred to as first and second "series" capacitors, respectively. Third capacitor 305 can have a first terminal coupled to node 303 disposed between capacitors 302 and 304 and a second terminal coupled to ground line 308 via resistor 306. Capacitor 305 coupled to ground line 308 in this way is sometimes referred to as a "shunt" capacitor.

Resistor 306 can have a first terminal coupled to shunt capacitor 305 and a second terminal coupled to ground power supply line 308 (e.g., a ground power supply terminal on which a ground voltage is provided). Resistor 306 coupled to ground line 308 in this way is sometimes referred to as a "shunt" resistor. Shunt resistor 306 can be an adjustable resistor implemented as a bank of switchable resistors (e.g., an array of resistors each of which is selectively activated by a respective switch), one or more transistors having gate terminals configured to receive an analog control voltage, a resistive ladder, a variable resistor (e.g., a digitally controlled resistor), one or more transistors coupled together in parallel and/or in series, and/or other components configured to provide a variable resistance. The resistance of resistor 306 can be adjusted or trimmed to optimize the amount of signal rejection/attenuation provided by notch filter 52. The example of FIG. 6 in which shunt capacitor 305 is interposed between node 303 and shunt resistor 306 is illustrative. If desired, the positions of components 305 and 306 can be swapped (e.g., shunt resistor 306 can be interposed between node 303 and shunt capacitor 305). More generally, shunt capacitor 305 and shunt resistor 306 are coupled in series between node 303 and ground 308.

Notch filter 52 of FIG. 6 can exhibit a notch (resonant) frequency computed as follows:

$$\omega\_\text{notch} = \sqrt{\frac{2R_L}{R_{sh}C_{sh}L} + \frac{2}{LC}} \tag{3}$$

where L represents the inductance of inductor 300, where C represents the capacitance of each of capacitors 302 and 304, where Rsh represents the resistance of shunt resistor 306, where Csh represents the capacitance of shunt capacitor 305, and where $R_L$ represents the parasitic ohmic resistance of inductor 300. Since the notch frequency is a function of Rsh, then the shunt resistance Rsh can be tuned to control the notch frequency of filter 52. The capacitance value of capacitor 302 should be equal to the capacitance value of capacitor 304. Moreover, the values of the various filter components should also adhere to the following equation:

$$\omega\_\text{notch}^2\left(LC^2 + R_L R_{sh} C^2 C_{sh}\right) = 2C + C_{sh} \tag{4}$$

Figure 7:
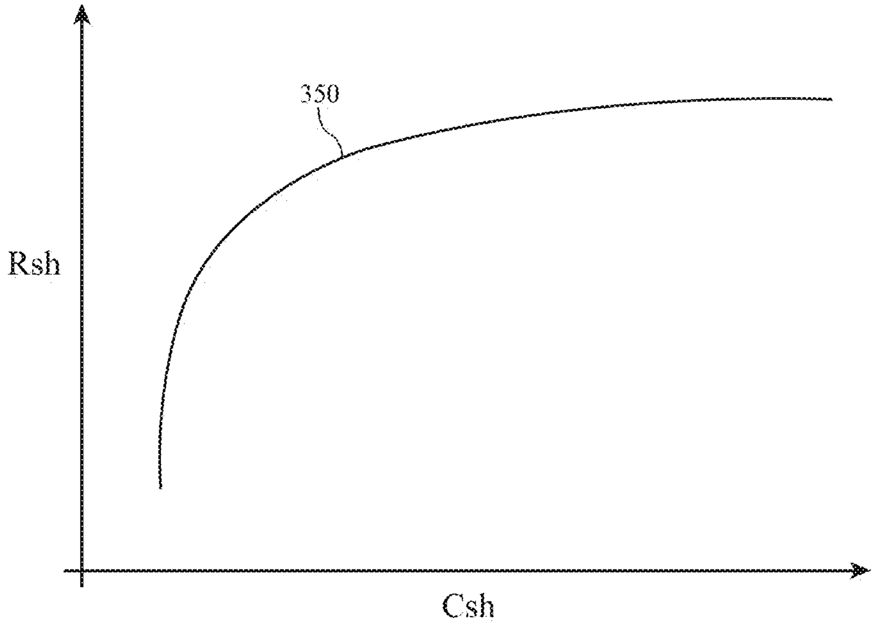
FIG. 7 is a plot illustrating a relationship between a shunt resistor and a shunt capacitor in the notch filter circuit shown in FIG. 6 in accordance with some embodiments.

The combination of equations (3) and (4) can establish a relationship between the resistance Rsh of shunt resistor 306 and the capacitance Csh of shunt capacitor 305, as shown by curve 350 of FIG. 7. As shown in FIG. 7, increasing Csh will generally result in increasing Rsh in accordance with the relationship established by curve 350, although by diminishing amounts at higher levels of Csh. The use of shunt resistor 206 can help ensure that the current flowing through series inductor 300 fully cancels out with the current flowing through the series capacitors at the resonant frequency. Moreover, the use of additional shunt capacitor 305 can help further reduce in-band loss at a target operating frequency different than the notch frequency. Notch filter 52 configured in this way is thus technically advantageous and beneficial to provide improved signal attenuation at the notch frequency with reduced in-band signal loss.

Figure 8:
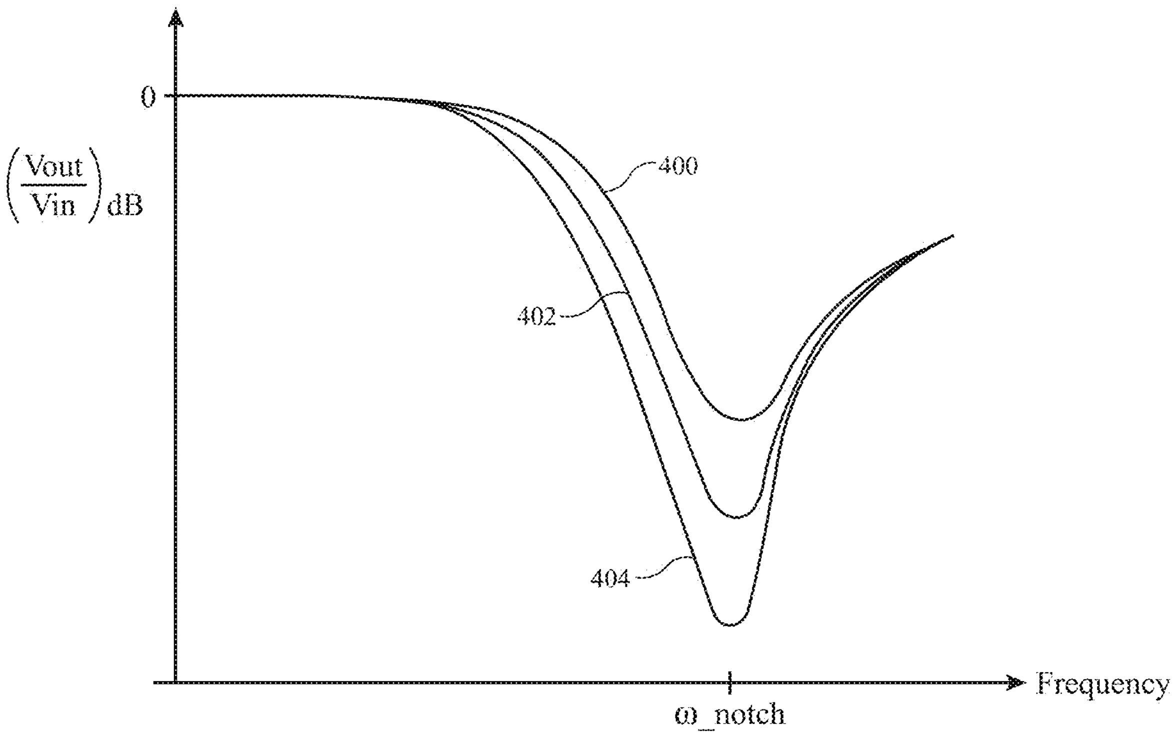
FIG. 8 is a diagram showing transfer functions of various types of notch filters in accordance with some embodiments.

FIG. 8 is a diagram showing transfer functions of various types of notch filters in accordance with some embodiments. In particular, FIG. 8 plots the magnitude of Vout divided by Vin (in decibel scale) as a function of angular frequency. Curve 400 represents a first filter response corresponding to a conventional LC filter that includes only an inductor (L) and a capacitor (C) connected to the inductor in parallel. Curve 402 represents a second filter response of notch filter 52 of the type described in connection with FIG. 5. Curve 404 represents a third filter response of notch filter 52 of the type described in connection with FIG. 6. As shown in FIG. 8, filter responses 402 and 404 both exhibit improved signal attenuation at the notch (resonant) frequency relative to curve 400 associated with the conventional LC-only notch filter.

The foregoing is merely illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A filter circuit comprising:

a first component of a first type coupled between a filter input port and a filter output port;

a second component of a second type, different than the first type, having a first terminal coupled to the filter input port and having a second terminal coupled to a node;

a third component of a third type, different than the first and second types, having a first terminal coupled to the node and having a second terminal coupled to a power supply line; and a shunt capacitor, separate from the second component, having a first terminal coupled to the node and a second terminal coupled to the first terminal of the third component.

2. The filter circuit of claim 1, wherein the first component of the first type comprises an inductor having a first terminal coupled to the filter input port and a second terminal coupled to the filter output port.

3. The filter circuit of claim 2, wherein the second component of the second type comprises a first capacitor.

4. The filter circuit of claim 3, wherein the third component of the third type comprises a shunt resistor.

5. The filter circuit of claim 4, wherein the power supply line comprises a ground line.

6. The filter circuit of claim 4, further comprising:

a fourth component of the second type having a first terminal coupled to the filter output port and having a second terminal coupled to the node.

7. The filter circuit of claim 6, wherein the fourth component of the second type comprises a second capacitor.

8. The filter circuit of claim 7, wherein the first capacitor has a first capacitance value, and wherein the second capacitor has a second capacitance value equal to the first capacitance value.

9. The filter circuit of claim 1, wherein the second component of the second type comprises a capacitor.

10. The filter circuit of claim 1, wherein the third component of the third type comprises a shunt resistor.

11. The filter circuit of claim 1, wherein the third component of the third type comprises a resistor, and wherein a notch frequency of the filter circuit is not dependent on a resistance of the resistor.

12. The filter circuit of claim 1, wherein:

the first component of the first type comprises an inductor with a parasitic ohmic resistance;

the second component of the second type comprises a capacitor; and the third component of the third type comprises a resistor having a resistance that is dependent on an inductance of the inductor, a capacitance of the capacitor, and the parasitic ohmic resistance.

13. The filter circuit of claim 1, wherein the third component of the third type comprises an adjustable resistor having a resistance that is tuned to control a notch frequency of the filter circuit.

14. The filter circuit of claim 1, further comprising:

a fourth component of the second type having a first terminal coupled to the filter output port and having a second terminal coupled to the node.

15. The filter circuit of claim 14, wherein:

the first component of the first type comprises a series inductor;

the second component of the second type comprises a first series capacitor;

the third component of the third type comprises a shunt resistor; and the fourth component of the second type comprises a second series capacitor.

16. A notch filter comprising:

a series inductor having a first terminal coupled to an input and having a second terminal coupled to an output;

a first series capacitor having a first terminal coupled to the input and having a second terminal coupled to a node;

a second series capacitor having a first terminal coupled to the output and having a second terminal coupled to the node;

a shunt resistor, separate from the first and second series capacitors, having a first terminal coupled to the node and having a second terminal coupled to a ground line; and a shunt capacitor, separate from the first and second series capacitors, coupled in series with the shunt resistor between the node and the ground line.

17. A notch filter comprising:

a series inductor having a first terminal coupled to an input and having a second terminal coupled to an output;

a first series capacitor having a first terminal coupled to the input and having a second terminal coupled to a node;

a second series capacitor having a first terminal coupled to the output and having a second terminal coupled to the node; and an adjustable shunt resistor having a first terminal directly coupled to the node and having a second terminal coupled to ground.

* * * * *